(12) United States Patent
Goetz et al.

(10) Patent No.: US 6,489,636 B1
(45) Date of Patent: Dec. 3, 2002

(54) INDIUM GALLIUM NITRIDE SMOOTHING STRUCTURES FOR III-NITRIDE DEVICES

(75) Inventors: Werner K. Goetz, Palo Alto, CA (US); Michael D. Camras, Sunnyvale, CA (US); Nathan F. Gardner, Mountain View, CA (US); R. Scott Kern, San Jose, CA (US); Andrew Y. Kim, Hayward, CA (US); Stephen A. Stockman, Morgan Hill, CA (US)

(73) Assignee: LumiLeds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/823,732

(22) Filed: Mar. 29, 2001

(51) Int. Cl.⁷ .............................................. H01L 33/00
(52) U.S. Cl. ........................... 257/94; 257/96; 257/103; 257/190
(58) Field of Search .............................. 257/13, 79, 94, 257/96, 103, 190; 374/45, 46

(56) References Cited

U.S. PATENT DOCUMENTS

| | | | |
|---|---|---|---|
| 5,684,309 A | * 11/1997 | McIntosh et al. | 257/191 |
| 5,798,537 A | * 8/1998 | Nitta | 257/103 |
| 5,909,040 A | * 6/1999 | Ohba et al. | 257/190 |
| 5,929,466 A | * 7/1999 | Ohba et al. | 257/103 |
| 6,067,309 A | * 5/2000 | Ohomura et al. | 372/46 |
| 6,172,382 B1 | 1/2001 | Nagahama et al. | 257/94 |
| 6,337,493 B1 | * 1/2002 | Tanizawa et al. | 257/79 |

FOREIGN PATENT DOCUMENTS

| | | |
|---|---|---|
| EP | 0800214 A1 | 10/1997 |
| EP | 1014455 | 6/2000 |
| EP | 1063711 | 12/2000 |
| JP | 2081484 | 3/1990 |
| JP | 2735057 | 4/1998 |
| JP | 2917742 | 7/1999 |

\* cited by examiner

*Primary Examiner*—Sara Crane
(74) *Attorney, Agent, or Firm*—Skjerven Morrill LLP; Norman R. Klivans, Jr.; Gergely T. Zimanyi

(57) ABSTRACT

A smoothing structure containing indium is formed between the substrate and the active region of a III-nitride light emitting device to improve the surface characteristics of the device layers. In some embodiments, the smoothing structure is a single layer, separated from the active region by a spacer layer which typically does not contain indium. The smoothing layer contains a composition of indium lower than the active region, and is typically deposited at a higher temperature than the active region. The spacer layer is typically deposited while reducing the temperature in the reactor from the smoothing layer deposition temperature to the active region deposition temperature. In other embodiments, a graded smoothing region is used to improve the surface characteristics. The smoothing region may have a graded composition, graded dopant concentration, or both.

24 Claims, 9 Drawing Sheets

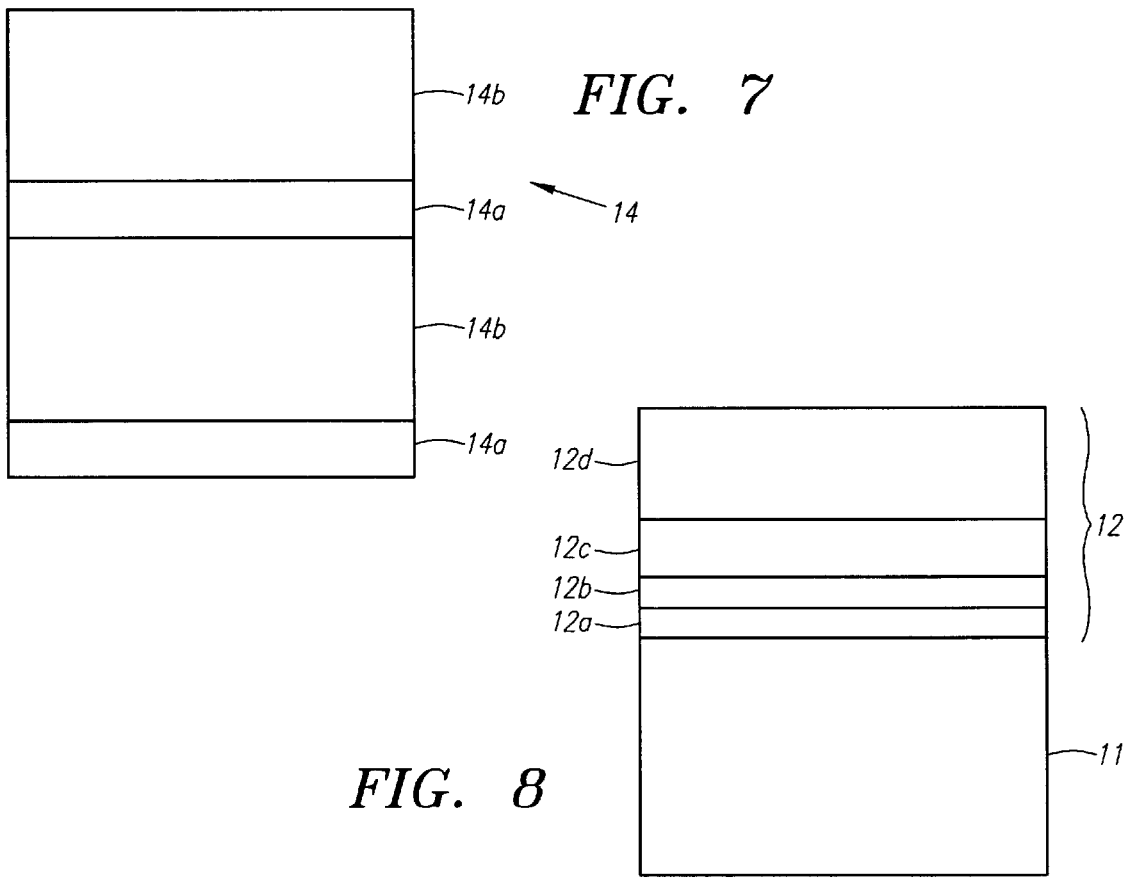
FIG. 7
FIG. 8
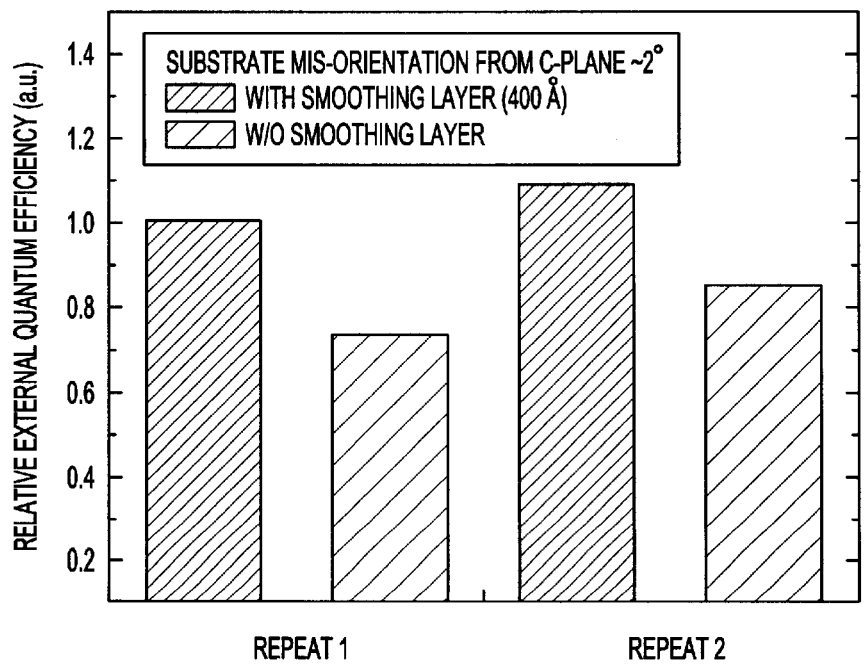
FIG. 9

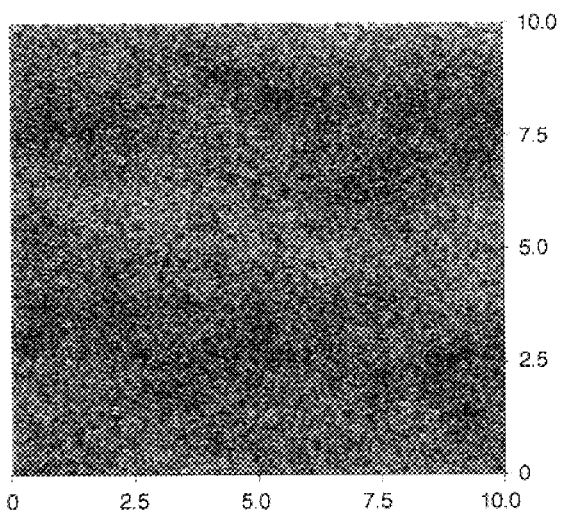 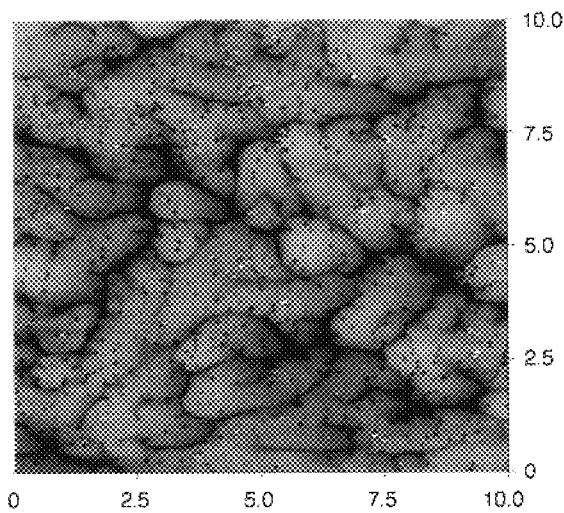
*FIG. 11A*  *FIG. 11B*

INDIUM GALLIUM NITRIDE SMOOTHING STRUCTURES FOR III-NITRIDE DEVICES

BACKGROUND

Semiconductor light-emitting diodes (LEDs) are among the most efficient light sources currently available. Materials systems currently of interest in the manufacture of high-brightness LEDs capable of operation across the visible spectrum are Group Ill-V semiconductors, particularly binary, ternary, and quaternary alloys of gallium, aluminum, indium, and nitrogen, also referred to as III-nitride materials. Typically, III-nitride layers are epitaxially grown on sapphire, silicon carbide, or gallium nitride substrates. Sapphire substrates are often used, despite their poor structural and thermal match with III-nitride layers, because of sapphire's wide availability, hexagonal symmetry, and ease of handling and pregrowth cleaning. See, for example, S. Strite and H. Morkoc, *GaN, AlN, and InN: A review*, J. Vac. Sci. Technol. B 10(4), July/August 1992, p. 1237.

To ensure LEDs with good performance, e.g., high brightness, high efficiency, or high reliability devices, the properties of layer interfaces must be carefully considered. Of particular interest are the layer interfaces below and within the active region. The quality of layer interfaces is controlled by the condition of the growth surface on which successive layers are deposited. Among conditions that lead to poor growth surface quality are substrate surface cleanliness, substrate surface misorientation, poor growth conditions, and impurities.

One method to achieve smooth GaN surface morphology is to grow a thick layer of GaN at high temperature (approximately 1100° C.) and high group-V-to-group-III molar gas phase concentration ratios. GaN layers grown in such a manner have a high lateral-to-vertical growth rate ratio compared with GaN layers grown under standard growth conditions, allowing the GaN layers to overgrow rough surfaces and provide a smooth surface for the growth of subsequent device layers grown on the GaN layer. However, in order to achieve a smooth, planar surface, GaN layers grown in this manner must be thick and require a long growth time. Further, In-containing active regions in an LED or laser diode may require surface smoothness conditions that differ from conditions that can be provided by the above-described method.

SUMMARY

In accordance with the invention, a smoothing structure containing indium to prepare for active region growth is formed between the substrate and the active region of a III-nitride light emitting device. In some embodiments, the smoothing structure is separated from the active region by a spacer layer, and the smoothing structure is at least 200 angstroms thick and within 0.5 microns of the active region. In a first embodiment, the smoothing structure is a single layer that is more heavily doped than the spacer layer. In a second embodiment, the spacer layer is thinner than a barrier layer in the active region of the device. In a third embodiment, a smoothing layer is used in combination with a misoriented substrate. The smoothing structures of the present invention may improve the surface characteristics of the layers grown over the smoothing structure, particularly the active region.

BRIEF DESCRIPTION OF THE DRAWINGS

FIG. 7 illustrates a compositional superlattice smoothing structure.

FIG. 8 illustrates an example of the n-type region of FIGS. 1, 2 and 5.

FIG. 9 illustrates the relative external quantum efficiency of devices with and without a smoothing layer.

FIGS. 11A and 11B illustrate atomic force microscope surface micrographs of III-nitride LED multiple quantum well active regions.

DETAILED DESCRIPTION

According to the present invention, a smoothing structure containing indium is incorporated into a III-nitride device in order to grow III-nitride epitaxial layers with desirable surface characteristics. In some embodiments, a spacer layer separates the smoothing structure from the active region. III-nitride semiconductor layers as used herein refers to compounds represented by the general formula $Al_xGa_yIn_{1-x-y}N (0 \leq x \leq 1, 0 \leq y \leq 1, 0 \leq x+y \leq 1)$, which may further contain group III elements such as boron and thallium and in which some of the nitrogen may be replaced by phosphorus, arsenic, antimony, or bismuth.

Figure 1:
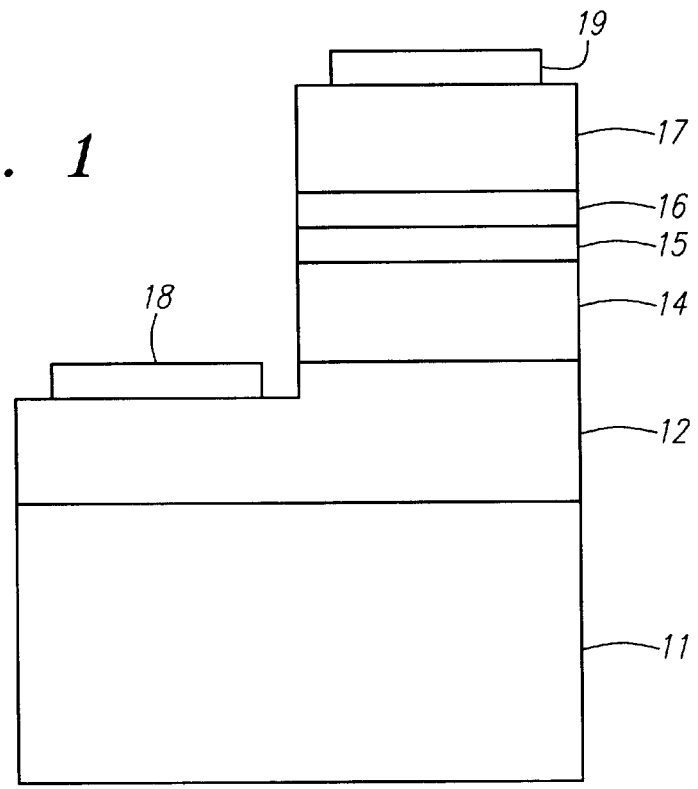
FIG. 1 illustrates an LED with a smoothing layer and a spacer layer in accordance with the present invention.

FIG. 1 illustrates a cross section of a III-nitride LED including a smoothing structure that is a single layer. An n-type region 12 is formed on a substrate 11 such as sapphire. The smoothing layer 14 is formed over n-type region 12. The smoothing layer is typically an n-type layer located beneath the active region, when viewing the LED with the substrate as the lowest layer, within 5000 angstroms of the active region. The smoothing layer can have a thickness ranging from about 200 angstroms to several microns. Smoothing layer 14 has a lower indium composition than active region 16. Typically, smoothing layer 14 is an InGaN layer containing 2–12% indium. In a preferred embodiment, the smoothing layer contains 2 to 6% indium.

Figure 2:
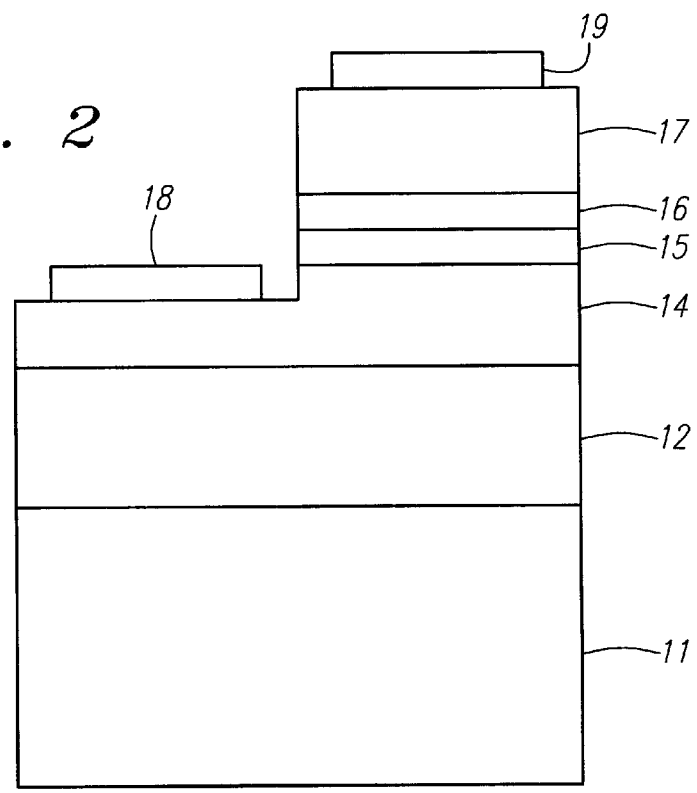
FIG. 2 illustrates an LED with the n-contact formed on the smoothing layer.

A spacer layer 15 separates active region 16 from smoothing layer 14. Spacer layer 15 typically does not contain In and may be, for example, GaN or AlGaN. Active region 16 is typically a multiple quantum well structure of AlInGaN or InGaN, with an indium composition between 5 and 50% and an aluminum composition between 0 and 50%. A p-type region 17 is formed over the active region. P-contact 19 is formed on the upper surface of p-type region 17, and an n-contact 18 is formed on an exposed portion of n-type region 12. Alternatively, n-contact 18 is formed on an exposed portion of smoothing layer 14, as illustrated in FIG. 2.

Figure 3:
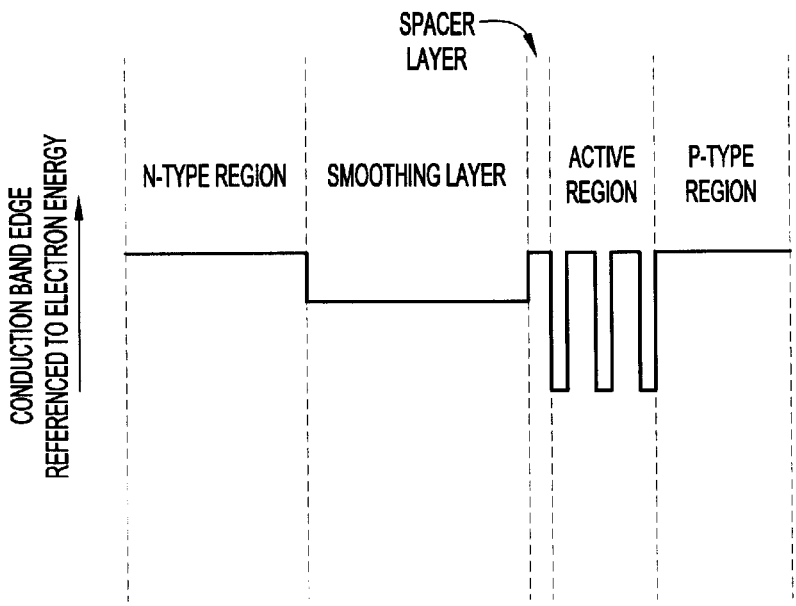
FIG. 3 illustrates the conduction band edge energy of the layers of the device illustrated in FIG. 1.

FIG. 3 illustrates the relative position of the conduction bandedge energy of the layers of the device illustrated in FIG. 1. As illustrated in FIG. 3, since smoothing layer 14 contains indium, it has a bandgap that is less than n-type region 12 and spacer layer 15. The bandgap of smoothing layer 14 is greater than the bandgap of active region 16. The high bandgap and small thickness of spacer layer 15 minimizes absorption in the spacer layer of light emitted from the active region. The higher bandgap of the smoothing layer 14 than the active region reduces absorption of light emitted from the active region in the smoothing layer.

In a first embodiment of the invention, the smoothing layer is more heavily doped than the spacer layer. The smoothing layer is doped with, for example, Si to a concentration between $2e17$ cm$^{-3}$ and $2e19$ cm$^{-3}$. In the first embodiment, the spacer layer is n-type and doped with, for example, Si to a concentration between undoped and $2e18$ cm$^{-3}$. In the first embodiment, the spacer layer has a thickness ranging from about 10 angstroms to 1 micron, with a typical thickness of 150 to 200 angstroms. Growth of the spacer layer allows the growth conditions, e.g. temperature, to be adjusted from the growth conditions of the smoothing layer to the growth conditions of the active region. The thickness of the spacer layer is optimized to be thick enough to stabilize growth conditions during fabrication for growth of the active region, and thin enough to not diminish the beneficial effects of the smoothing layer on the surface characteristics of the semiconductor layers grown over the smoothing layer.

The spacer layer of the first embodiment has a dopant concentration lower than n-type region 12, thus the spacer layer is a more resistive layer that can help to spread current evenly into the active region, preventing current from crowding in the shortest paths between the n-contact and the p-contact. The thickness of the spacer layer is selected based on the dopant concentration in the spacer layer such that the spacer layer does not significantly add to the forward voltage of the device.

Figure 4:
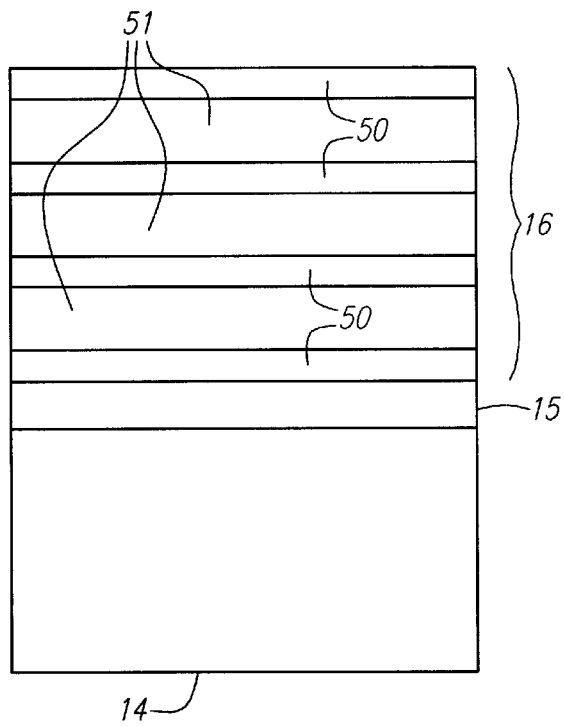
FIG. 4 illustrates the active region, spacer layer, and smoothing layer of one embodiment of the invention.

FIG. 4 illustrates the active region, spacer layer, and smoothing layer of a second embodiment of the invention. The active region 16 of the device is typically a multiple quantum well structure, with at least one barrier layer 51 separating two or more well layers 50. Though four wells and three barriers are illustrated, the active region can have more or fewer well layers and barrier layers, or be a single quantum well active region. In the second embodiment, the spacer layer 15 is thinner than the thickness of a barrier layer. Barrier layers 51 can range in thickness from 25 angstroms to one micron, and are typically about 100 to 150 angstroms thick. Thus, in the second embodiment, the spacer layer typically has a thickness ranging from about ten angstroms to about 150 angstroms. Forming a spacer layer that is thinner than the barrier layers in the active region is beneficial because as the spacer layer gets thicker, the smoothing layer underlying the spacer layer may be less able to influence the surface characteristics of layers grown over the smoothing layer.

Figure 13:
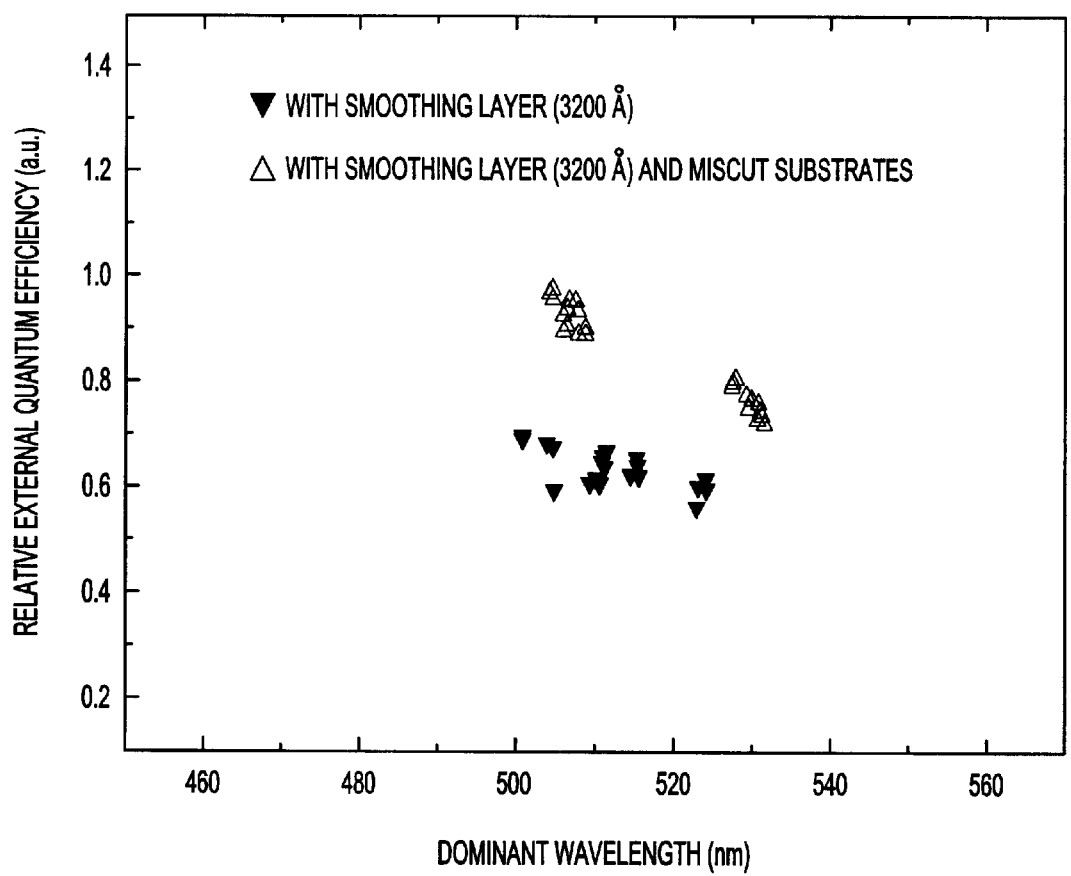
FIG. 13 illustrates the relative external quantum efficiency of devices with a smoothing layer combined with an intentionally misoriented substrate.

In a third embodiment, a smoothing structure is incorporated into a device grown on a miscut substrate. Such devices may show a further improvement in device performance. Miscut substrates are prepared such that the first surface upon which growth is initiated deviates in orientation by a small angle from a major crystallographic plane, for example the (0001) c-plane of sapphire. Miscut substrates have been used in several materials systems, including III-nitrides, for different purposes. However, in accordance with the present invention, the combination of miscut substrates with a smoothing layer may result in a larger improvement in device performance than either taken alone, as illustrated in FIG. 13. The magnitude of the miscut is important when the combination of smoothing layers and miscut substrates is implemented. In general, we anticipate that there is an optimal miscut angle, which depends on the smoothing layer thickness, composition, and the dopant concentration of the n-type region. The optimal miscut angle may also depend on growth conditions. In principle, the combination of smoothing layers with miscut substrates is effective for all substrates, including sapphire, silicon carbide, and GaN. Improved device performance has been observed in devices grown on miscut sapphire substrates ranging from 0.2 to 2 degrees off the (0001) c-plane of sapphire.

Figure 5:
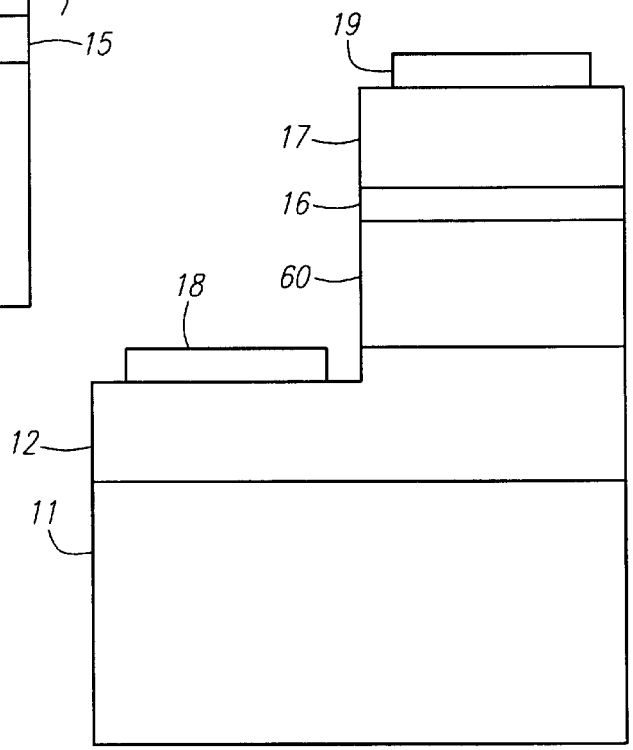
FIG. 5 illustrates an LED with a graded smoothing region.

A fourth embodiment of the device is illustrated in FIG. 5. In the fourth embodiment, the smoothing structure is a graded smoothing region 60. Graded smoothing region 60 may have a graded composition, such as indium composition or aluminum composition, a graded dopant concentration, or both a graded composition and a graded dopant concentration. Devices incorporating a graded smoothing region 60 may or may not include a spacer layer of constant composition and constant dopant concentration between the graded smoothing region and the active region. In combination with a graded smoothing region, the spacer layer may be, for example, doped or undoped GaN, AlGaN, InGaN, or AlInGaN. Typically, some portion of the graded smoothing region contains indium.

As used herein, the term "graded smoothing region" is meant to encompass any structure that achieves a change in composition and/or dopant concentration in any manner other than a single step in composition and/or dopant concentration. In one example, the graded smoothing region is a stack of layers, each of the layers having a different composition and/or dopant concentration than either layer adjacent to it. If the layers are of resolvable thickness, the graded smoothing region is known as a step-graded or index-graded region. In the limit where the thickness of individual layers approaches zero, the graded smoothing region is known as a continuously-graded region. The layers making up the graded smoothing region can be arranged to form a variety of profiles in composition and/or dopant concentration versus thickness, including, but not limited to, linear grades, parabolic grades, and power-law grades. Also, graded smoothing region s are not limited to a single grading profile, but may include portions with different grading profiles and one or more portions with substantially constant composition and/or dopant concentration regions.

Figure 6A:
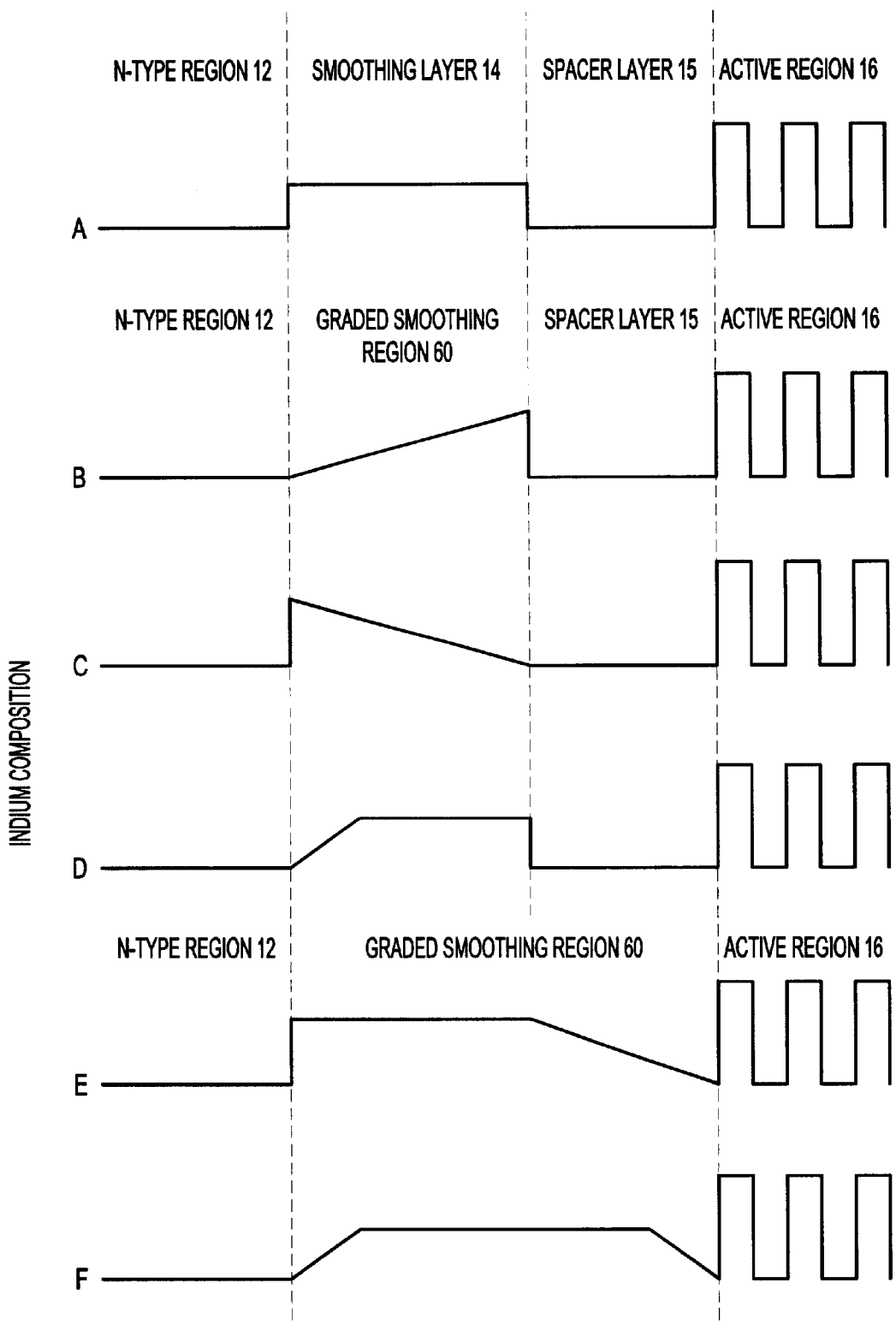
FIG. 6A illustrates the indium composition of devices with and without compositional grading in the smoothing region.

FIG. 6A illustrates the indium composition of the layers of a device with no compositional grading and five devices having indium-composition grading in graded smoothing region 60 of FIG. 5. Device A is the device illustrated in FIGS. 1 and 2. In device A, n-type region 12 has no indium, smoothing layer 14 contains some indium, spacer layer 15 has no indium, and the active region has several indium rich well layers.

Devices B, C, and D each have a graded indium composition in the smoothing region and a spacer layer of constant composition separating the graded smoothing region from the active region. In device B, n-type region 12 contains no indium. In graded smoothing region 60, the indium composition is gradually increased through smoothing region 60. The indium composition can be increased, for example, by gradually increasing the ratio of the flow rate of indium-containing precursor gases to the flow rate of gallium-containing precursor gases during growth, or by gradually lowering the growth temperature while keeping the ratio of the flow rates of indium- and gallium-containing precursor gases constant. In device C, the indium composition is first abruptly increased, then gradually decreased through graded smoothing region 60. The indium composition can be decreased, for example, by gradually decreasing the ratio of the flow rate of indium-containing precursor gases to the flow rate of gallium-containing precursor gases during growth, and/or by gradually raising the growth temperature. The indium composition may vary in devices B and C, for example, from 0% to about 12%. Spacer layer 15 is adjacent to the active region and contains little or no indium. In device D, the indium composition is increased in a first portion of graded smoothing region 60, then held constant through a second portion of the graded smoothing region.

Devices E and F do not have a constant composition and dopant concentration spacer layer adjacent to the active region. Devices that do not incorporate a spacer layer do not necessarily have thicker graded smoothing regions 60 than devices that do incorporate spacer layers. In device E, a lower portion of graded smoothing region 60 has a constant indium composition. The composition of indium in the upper portion of the smoothing region is then reduced, for example, from about 12% in the lower portion of the smoothing region to about 0% in the portion of the smoothing region adjacent to the active region. As described above, the composition of indium in the graded smoothing region is reduced by decreasing the ratio of the flow rate of indium-containing precursor gases to the flow rate of gallium-containing precursor gases during growth and/or by raising the temperature during growth. In device F, a first portion of the graded smoothing region has an increasing composition of indium, a second portion has a constant indium composition, then a third portion has a decreasing composition of indium.

The devices illustrated in FIG. 6A are merely examples of compositional grading possible in graded smoothing region 60, and are not intended to represent all the ways that the composition in these layers may be graded in accordance with the invention. Many other compositional grading schemes are possible, as is apparent to one skilled in the art. For example, compositional grading need not be linear, it can be, for example, parabolic. Further, any of the compositional grading schemes described above can be implemented with or without spacer layers, and with or without dopant concentration grading or composition grading of group III elements other than indium.

Compositional grading as described above in reference to FIG. 6A may offer several advantages. Graded composition region s can be used to engineer the band structure of the device, both by grading band gap and piezoelectric charge between adjacent layers. Graded composition region s also eliminate the need for growth interruptions to change process conditions between adjacent layers, since the process conditions such as reactor temperature and precursor gas flow rate can be adjusted gradually through the graded region. Growth interruptions may cause impurity accumulation, crystal defect formation, and surface etching at the interfaces between layers, so the removal of growth interruptions via graded regions not only simplifies the growth process, but improves device performance by eliminating problems at interfaces that can reduce carrier confinement and efficiently trap carriers. The compositionally graded smoothing region should be designed for minimal absorption of light emitted by the active region. Preferably, the minimum bandgap energy within the smoothing region should be larger than the photon energy of light emitted from the active region.

Figure 6B:
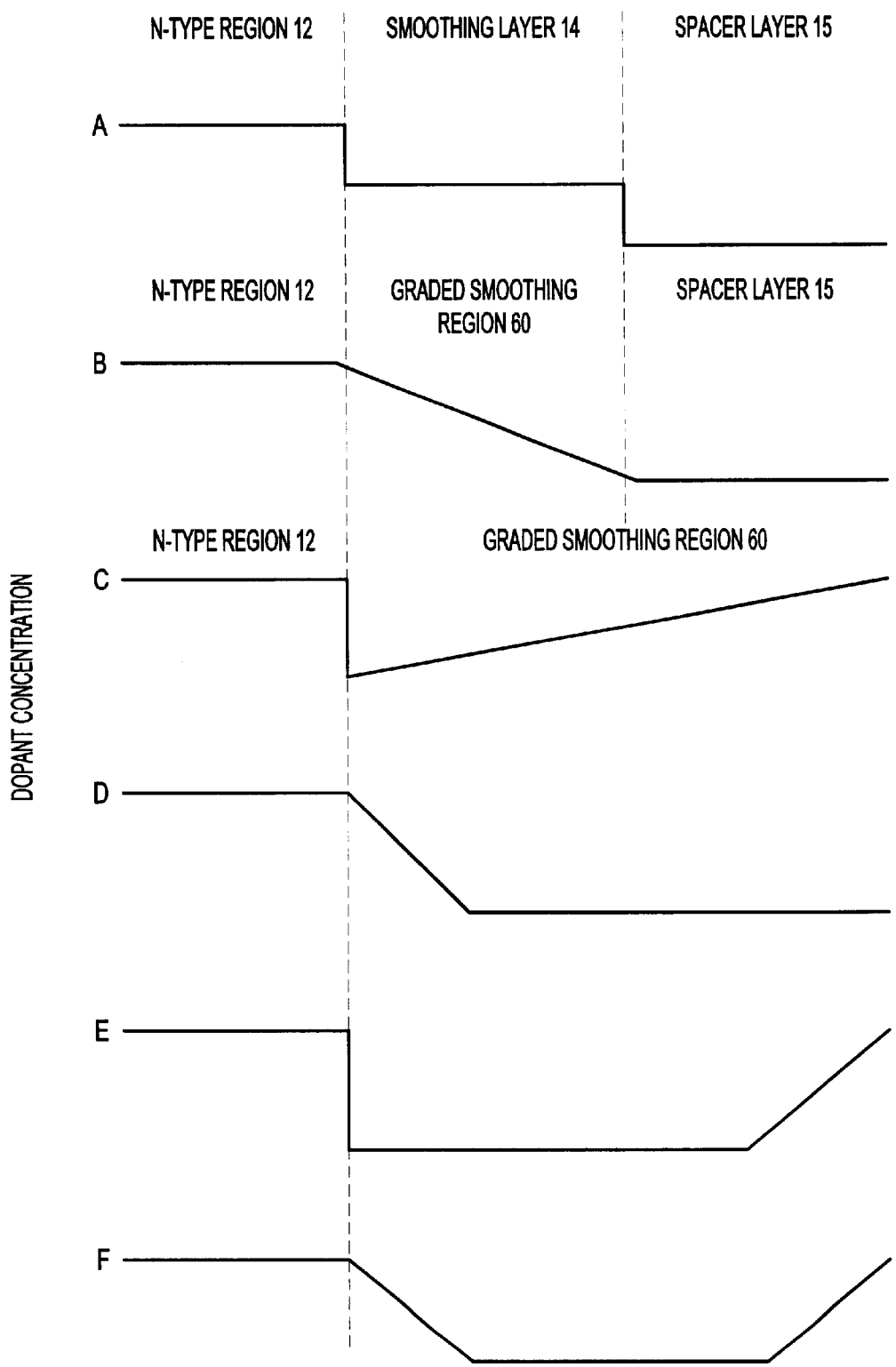
FIG. 6B illustrates the dopant concentration of devices with and without dopant concentration grading in the smoothing region.

In addition to or instead of grading composition, the dopant concentration in smoothing region 60 may be graded. FIG. 6B illustrates a device with no dopant concentration grading and five devices with dopant concentration grading. Device A is a device such as that described in the first embodiment. N-type region 12 is highly doped, smoothing layer 14 is doped less than n-type region 12, and spacer layer 15 is doped less than smoothing layer 14. Each of n-type region 12, smoothing layer 14, and spacer layer 15 have a substantially uniform dopant concentration.

In device B, n-type region 12 has a uniform dopant concentration, then the dopant concentration is gradually reduced through graded smoothing region 60. Device B includes a spacer layer 15 of constant dopant concentration between the graded smoothing region 60 and the active region (not shown). In devices C, D, E, and F, no spacer layer separates graded smoothing region 60 from the active region (not shown). In device C, the concentration of dopant is abruptly reduced, then gradually increased through graded smoothing region 60. In device D, the concentration of dopant is first gradually reduced in a first portion of the smoothing region, then held constant through a second portion of the graded smoothing region adjacent to the active region. In device E, the dopant concentration is first abruptly reduced, then held constant in a first portion of the smoothing region, then gradually increased through a second portion of the smoothing region adjacent to the active region. In device F, the dopant concentration is gradually reduced in a first portion of the smoothing region, then held constant in a second portion of the smoothing region, then gradually increased in a third portion of the smoothing region adjacent to the active region.

The devices illustrated in FIG. 6B are merely examples of dopant concentration grading possible in graded smoothing region 60, and are not intended to represent all the ways that the dopant concentration in these layers may be graded in accordance with the invention. For example, the dopant concentration need not be linear as illustrated in FIG. 6B. Also, any of the dopant concentration grading schemes described above can be implemented with or without spacer layers, and with or without compositional grading. Grading the dopant concentration in graded smoothing layer 60 may offer advantages, such as process simplification or compensation of piezoelectric charge to reduce the forward voltage of the LED or laser diode.

Figure 6C:
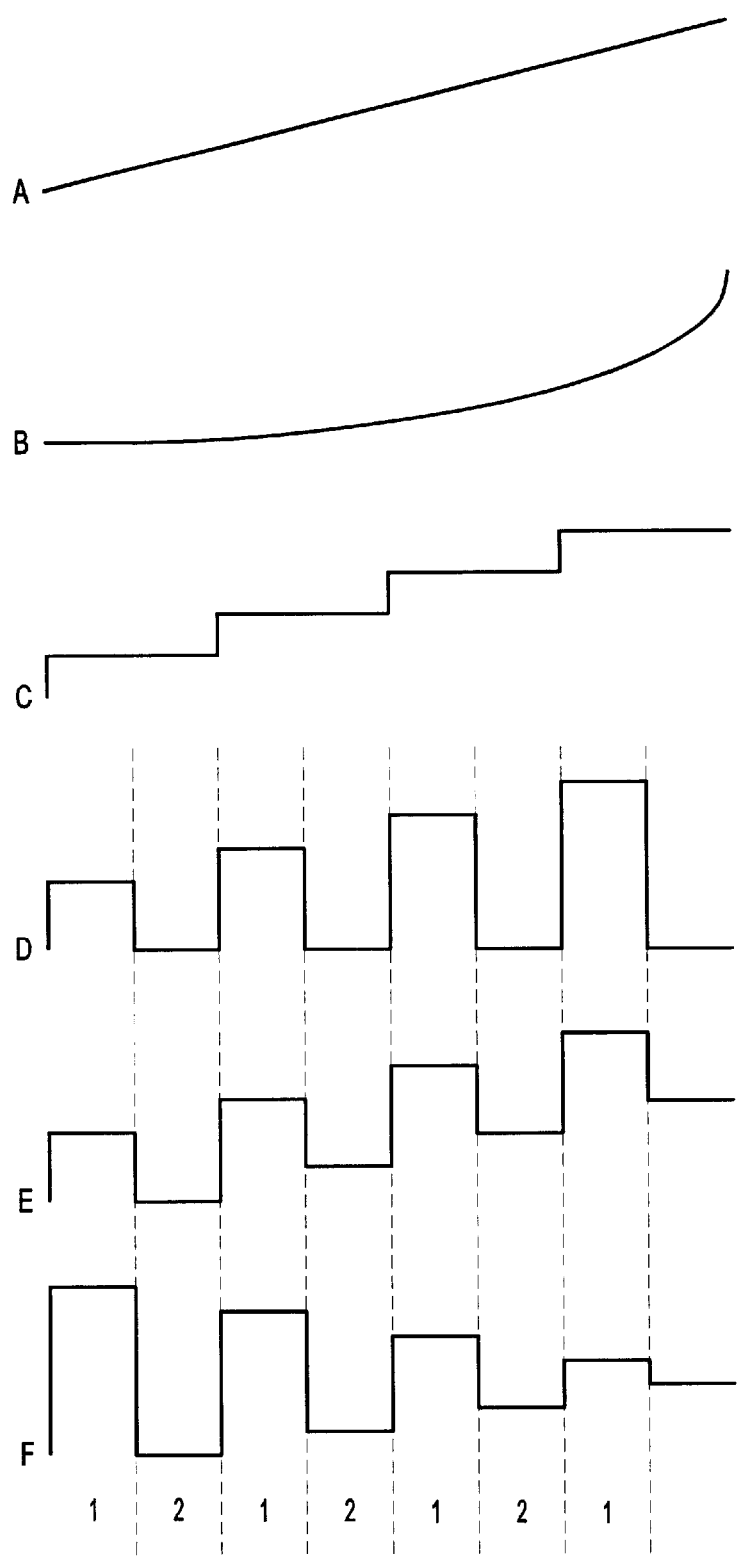
FIG. 6C illustrates six examples of grading profiles.

FIG. 6C illustrates six examples of possible grading profiles. The grading profiles illustrated in FIGS. 6A and 6B need not be linear, as shown in grading profile A of FIG. 6C. The grading profiles can also be nonlinear monotonic profiles, such as the parabolic profile illustrated in grading profile B or the stepped profile illustrated in grading profile C.

Alternatively, the grading profiles can be superlattice structures that are not monotonic, as illustrated in grading profiles D, E, and F. In graded superlattices, the layers making up the graded smoothing region alternate systematically in a fashion such that the moving average composition and/or dopant concentration of the layers varies along the thickness of the graded smoothing region in a manner similar to that described above for non-superlattice regions.

Superlattice grading profiles E and F are appropriate for composition grading, and profiles D, E, and F are appropriate for dopant concentration grading. In superlattices D, E, and F, sets of layers with different grading profiles alternate. The layer sets are arbitrarily named "1" and "2" in grading profiles D, E, and F. In profile D, the dopant concentration increases in the first set of layers (labeled "1"). The layers in the first set alternate with layers in the second set of layers (labeled "2") which have a constant dopant concentration. In profile E, the dopant concentration or indium composition increases in both the first and second set of layers. However, the layers in the first set increase over a different composition or dopant concentration range than the layers in the second set, thus the overall structure is not monotonic. In profile F, the dopant concentration or indium composition decreases in the first set of layers, and increases in the second set of layers.

In a fifth embodiment of the invention, the smoothing structure is a compositional superlattice, i.e. a stack of alternating thin layers of GaN-based materials with different compositions. FIG. 7 illustrates a smoothing superlattice in accordance with the fifth embodiment. The superlattice is made up of alternating layers 14a and 14b of high indium composition materials and low indium composition materials. High In composition layers 14a are, for example, about 10 to about 30 angstroms thick and have an indium composition between about 3 and 12%. Low In composition layers 14b are, for example, about 30 to about 100 angstroms thick and have an indium composition between about 0 and 6%.

In some embodiments, a device may incorporate several smoothing layers in order to achieve the desired surface smoothness. FIG. 8 illustrates one example of n-type region 12 of FIGS. 1, 2, and 5 in more detail. N-type region 12 can include a nucleation layer 12a formed over substrate 11. An undoped GaN layer 12b with a thickness of about 0.5 $\mu$m overlays nucleation layer 12a. Doped GaN layers 12c and 12d overlay undoped layer 12b. layer 12c is a moderately doped GaN layer with a thickness of about 1 $\mu$m and an n-type dopant concentration of about 1e18 cm$^{-3}$. layer 12d is a more heavily doped layer contact layer with a thickness of about 2 $\mu$m and an n-type dopant concentration of about 1e 19 cm$^{-3}$. Additional indium-containing smoothing structures may be positioned between layers 12a and 12b, between layers 12b and 12c, and between layers 12c and 12d, or within any of the layers. In embodiments incorporating multiple smoothing layers at interfaces between layers or within the layers of the device, at least 100 angstroms of III-nitride material preferably separates the smoothing layers.

The device illustrated in FIG. 1 may be fabricated by first polishing substrate 11, such as SiC, sapphire, GaN, or any other suitable substrate, on one or both sides then preparing the substrate for growth with various cleans. GaN-based semiconductor layers 12, 14, 15, 16, and 17 are then epitaxially grown on substrate 11 through metal-organic chemical vapor deposition, molecular beam epitaxy, or another epitaxial technique. The substrate is placed in a reactor and precursor gases, such as tri-methyl gallium and ammonia, are introduced which react at the surface of the substrate to form GaN. First, a III-nitride nucleation layer such as AlN, GaN, or InGaN may be grown over substrate 11. N-type region 12 doped with, for example, Si, Ge, or O, is then fabricated over the nucleation layer. N-type region 12 is typically formed at about 1050° C.

Smoothing layer 14 according to the first, second, or third embodiment may be formed by, for example, removing the tri-methyl gallium from the reactor, then introducing tri-methyl indium, tri-ethyl gallium, and ammonia into the reactor. Smoothing layer 14 is grown at a lower temperature than the n-type region (grown at about 1050° C.) and at a higher temperature than the active region (grown between 700 and 900° C.), for example 960° C. Formation of the smoothing layer at a higher temperature than the active region typically results in better surface characteristics of the smoothing layer, and therefore of the layers grown over the smoothing layer. After smoothing layer growth is finished, the indium-containing gas is removed, and GaN or AlGaN spacer layer 15 is formed. The first part of spacer layer 15 is fabricated while lowering the temperature from the smoothing layer growth temperature to the active region growth temperature, typically between 700 and 900° C. The second part of spacer layer 15 is fabricated at the active region growth temperature to stabilize the growth temperature for active region growth.

Graded smoothing region s according to the fourth embodiment of the invention are grown by altering the process conditions described above, as described in reference to FIGS. 6A and 6B. For example, an indium-composition graded smoothing region can be grown by gradually changing the temperature and/or the ratio of the flow rates of the indium-containing precursor gas to gallium-containing precursor gas during growth. A dopant concentration graded region can be grown by gradually changing the ratio of flow rate of a dopant-containing gas to the flow rate of the group-III containing gases during growth.

When spacer layer 15 is finished growing, the flow rates of indium- and gallium-containing precursor gases are adjusted to form the well and barrier layers of active region 16. The growth temperature affects how much indium is incorporated into a layer, though the composition of a layer can be also be controlled by other process conditions such as the ratio of the flow rates of the indium- and gallium-containing precursor gas. Typically, the higher the temperature, the less indium is incorporated. Since smoothing layer 14 and active region 16 both typically contain indium, if the device did not include a spacer layer 15, growth would have to be stopped after the formation of smoothing layer 14 to allow the reactor to cool, in order to form the active region 16 with the proper composition of indium. Stopping growth in order to allow the reactor to cool can allow impurity accumulation or surface etching to occur at the surface of the smoothing layer, which can harm smoothing layer and subsequent layer surface characteristics and device performance.

After the active region is formed, other precursor gases are added and/or removed to form p-type region 17 of AlGaN or GaN doped with, for example, Mg. P-type layers which may be optimized for conductivity or ohmic contact formation may be formed within p-type region 17. A p-metalization layer, which will later form the p-contact, is then deposited over the semiconductor layers. The device is patterned and portions of the p-metalization layer, the p-type semiconductor layers, the active region, and the n-type semiconductor layers are etched away to expose a portion of n-type region 12. An n-contact is then deposited on the exposed portion of n-type region 12. In another embodiment illustrated in FIG. 2, the etch does not penetrate into n-type region 12, rather it exposes a portion of n-type smoothing layer 14. In this embodiment, the n-contact is formed on smoothing layer 14. N- and p-contacts may be, for example, Au, Ni, Al, Pt, Co, Ag, Ti, Pd, Rh, Ru, Re, and W, or alloys thereof.

In accordance with the invention, devices incorporating indium-containing smoothing structures may offer several advantages. First, the use of a smoothing structure can recover two-dimensional step-flow-type growth of smooth semiconductor surfaces, even after undesirable three-dimensional island growth has begun. Three dimensional island growth can be caused by large substrate surface misorientation, poor surface preparation, or growth initiation steps, such as silicon dosing, designed to reduce the density of crystal dislocations. As described above, surface morphology has an impact on device performance; thus smoothing structures may enhance both the efficiency and the reliability of III-nitride LEDs.

FIG. 9 illustrates the external quantum efficiency of LEDs grown on misoriented substrates with large misorientation angle (e.g. 2 degrees from the c-plane) and grown with and without smoothing layers. GaN-based semiconductor layers are typically grown on the c plane (0001) of sapphire, as GaN grown on (0001) sapphire exhibits superior crystallinity to GaN grown on other planes of sapphire. If the GaN-growth surface of the sapphire substrate is significantly misoriented from (0001) and the device does not include a smoothing layer, the surface characteristics of the epitaxially-grown GaN layers and device performance can suffer. FIG. 9 demonstrates the ability of a smoothing layer to eliminate poor device performance caused by growth on misoriented substrates. The devices grown with a smoothing layer are much more efficient than the devices grown without a smoothing layer.

Figure 10:
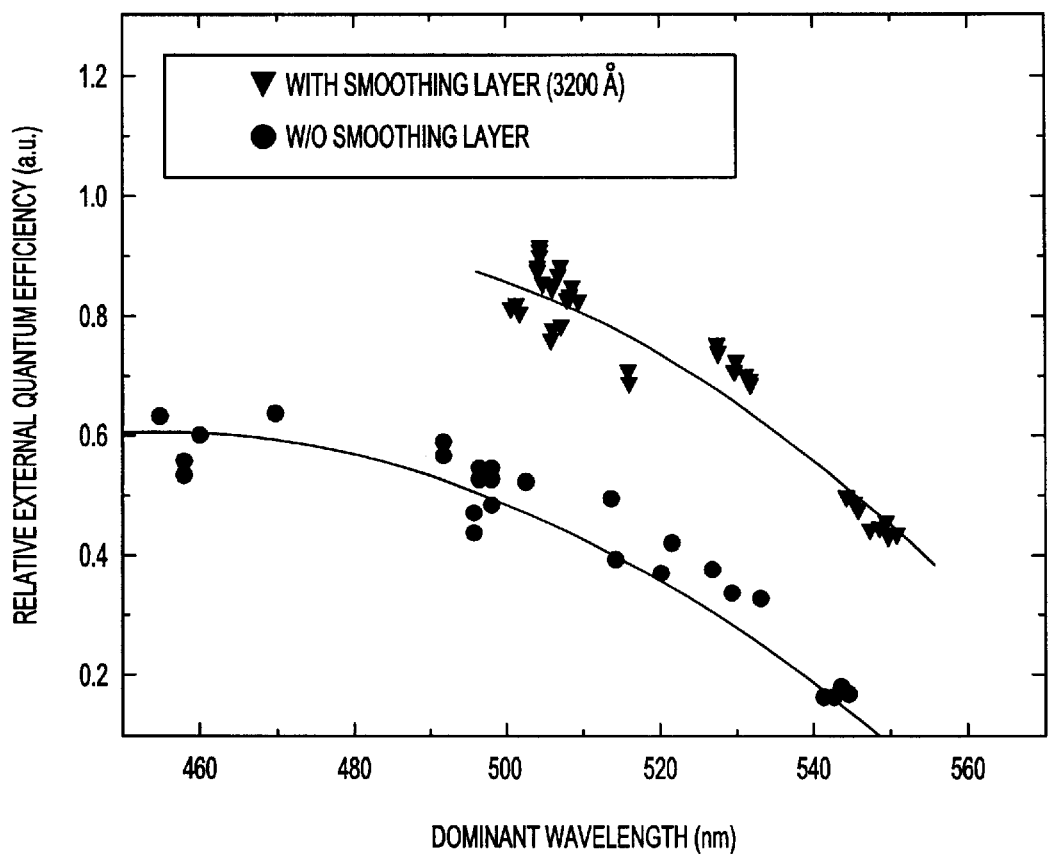
FIG. 10 illustrates the relative external quantum efficiency of devices with and without a smoothing layer.

Second, the use of an InGaN smoothing layer beneath the active region increases the brightness of the resulting device. FIG. 10 illustrates the relative efficiency of devices produced with and without InGaN smoothing layers. The triangles represent devices with an InGaN smoothing layer, and the circles represent devices without an InGaN smoothing layer. As illustrated in FIG. 10 the use of an InGaN smoothing layer produces a device that is about twice as efficient as a device of the same color without an InGaN smoothing layer.

The ability of smoothing layers to recover two dimensional growth after three dimensional growth has begun is demonstrated by FIGS. 11A and 11B, which illustrate the effect of smoothing layers on silicon dosing. Silicon dosing has been proposed as a method of reducing extended structural defects in GaN layers. During growth, the GaN layer is exposed to silane, which may deposit on the surface of the GaN as SiN. When growth is started again, the resulting GaN has fewer dislocations. However, silicon dosing can lead to three-dimensional island growth. FIGS. 11A and 11B are micrographs derived from Atomic Force Microscopy measurements for LED multiple quantum well (MQW) structures. In both cases, a surface below the active region was exposed to silicon dosing. FIG. 11B illustrates a MQW active region without a smoothing layer. Silicon-dosing has caused three-dimensional island growth which results in an extremely rough surface. FIG. 11A illustrates a similar MQW structure, but with a smoothing layer between the Si-dosed layer and the MQW. The smoothing layer beneath the MQW has restored the smooth two-dimensional growth of low-temperature III-nitride. Thus, the benefit of reduced defect density as accomplished by the Si-dosing technique can be utilized for LED structures, because the smoothing structures according to the present invention may provide smooth interfaces. The luminescence efficiency of two Si-dosed MQW structures is illustrated in Table 1.

TABLE 1

| MQW Structure | Si-dosing below smoothing layer | Si-dosing, no smoothing layer |
|---|---|---|
| Normalized Light Intensity | 100% | 7% |
| Surface Morphology | Smooth | Islands |

The first structure includes a smoothing layer grown on top of a Si-dosed surface. The first structure exhibits bright luminescence. The intensity of the first structure was normalized to 100%. The second structure is Si-dosed and did not include the smoothing layer. The luminescence efficiency is severely reduced.

Third, smoothing layers may expand the temperature range in which III-nitride layers with smooth surface morphologies can be grown. Conventionally, MOCVD growth of GaN or AlGaN is limited to a small temperature window, as high temperature typically results in undesirable hexagonal surface features, and low temperature results in the formation of pits. Finally, smoothing layers allow growth of smooth III-nitride layers without greatly increasing the complexity of device fabrication.

Figure 12:
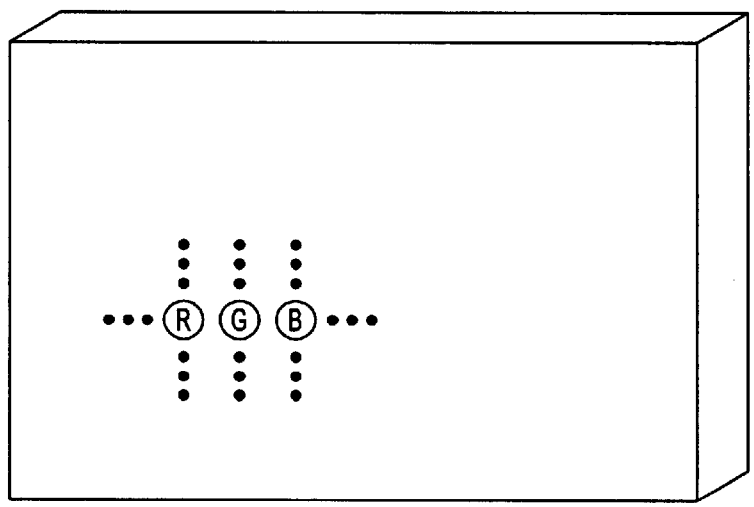
FIG. 12 illustrates a display device incorporating LEDs according to embodiments of the present invention.

Blue and green LEDs formed in accordance with the invention are particularly suitable for color displays using red, green, and blue LEDs as the pixel elements. Such displays are well known and are represented by FIG. 12. A display panel has an array of red, green, and blue LEDs, respectively, that are selectively illuminated by well known circuitry to display an image. Only three pixels are shown in FIG. 12 for simplicity. In one embodiment, each primary color is arranged in columns. In other embodiments, the primary colors are arranged in other patterns, such as triangles. The LEDs may also be used for backlighting an LCD display. Additionally, blue- or UV-emitting LEDs formed in accordance with the present invention may be used in combination with various phosphor materials to generate white light.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention. For example, the smoothing structures of the present invention are not limited to light emitting devices (e.g. LEDs and laser diodes) and may be applied to photo detectors, electronic devices, bipolar transistors, and devices where interface quality is critical, such as high-electron mobility field-effect transistors.

We claim:
1. A III-nitride light emitting device comprising:
a substrate;
an n-type region overlying the substrate;
an active region overlying the n-type region;
a smoothing layer containing indium, the smoothing layer being at least 200 angstroms thick and located between the substrate and the active region; and
a spacer layer located between the smoothing layer and the active region;
wherein the smoothing layer contains a greater dopant concentration than the spacer layer and a surface of the smoothing layer is located less than one half of one micron from a surface of the active region.
2. The light emitting device of claim 1 further comprising an n-contact connected to the smoothing layer.

3. The light emitting device of claim 1 wherein the spacer layer has an n-type dopant concentration ranging from undoped to about $2e18$ cm$^{-3}$.

4. The light emitting device of claim 1 wherein the smoothing layer has an n-type dopant concentration ranging from about $2e17$ cm$^{-3}$ to about $2e19$ cm$^{-3}$.

5. The light emitting device of claim 1 wherein the smoothing layer is InGaN having a composition of In between about 2 and about 12 percent.

6. The light emitting device of claim 1 wherein the smoothing layer is doped with Si.

7. The light emitting device of claim 1 wherein the spacer layer has a thickness of about 10 angstroms to about one half of one micron.

8. The light emitting device of claim 1 wherein the smoothing layer has a thickness of about 200 angstroms to about 4 microns.

9. The light emitting device of claim 1 wherein the smoothing layer is adjacent to the spacer layer.

10. The light emitting device of claim 1 wherein the spacer layer is GaN or AlGaN.

11. A III-nitride light emitting device comprising:

a substrate;

an n-type region overlying the substrate;

an active region overlying the n-type region, the active region comprising at least one well layer and at least one barrier layer;

a smoothing layer containing indium, the smoothing layer being at least 200 angstroms thick and located between the substrate and the active region; and a spacer layer located between the smoothing layer and the active region, wherein the spacer layer is thinner than a barrier layer;

wherein a surface of the smoothing layer is located less than one half of one micron from a surface of the active region.

12. The light emitting device of claim 11 further comprising an n-contact connected to the smoothing layer.

13. The light emitting device of claim 11 wherein the spacer layer has an n-type dopant concentration ranging from undoped to about $2e18$ cm$^{-3}$.

14. The light emitting device of claim 11 wherein the smoothing layer has an n-type dopant concentration ranging from about $2e17$ cm$^{-3}$ to about $2e19$ cm$^{-3}$.

15. The light emitting device of claim 11 wherein the smoothing layer is InGaN having a composition of In between about 2 and about 12 percent.

16. The light emitting device of claim 11 wherein the smoothing layer is doped with Si.

17. The light emitting device of claim 11 wherein the spacer layer has a thickness of about 10 angstroms to about one half of one micron.

18. The light emitting device of claim 11 wherein the smoothing layer has a thickness of about 200 angstroms to about 4 microns.

19. The light emitting device of claim 11 wherein the smoothing layer is adjacent to the spacer layer.

20. The light emitting device of claim 11 wherein the spacer layer is GaN or AlGaN.

21. A III-nitride light emitting device comprising:

a substrate having a growth surface;

an n-type region overlying the growth surface of the substrate;

an active region overlying the n-type region; and a smoothing layer containing indium, the smoothing layer being located between the substrate and the active region;

wherein the growth surface is misoriented from a crystallographic plane of the substrate.

22. The light emitting device of claim 21 wherein the substrate is sapphire and the crystallographic plane is c-plane.

23. The light emitting device of claim 21 wherein the growth surface is misoriented from the crystallographic plane by about 0.2° to about 2°.

24. A display device comprising:

at least one blue light emitting device;

at least one green light emitting device; and at least one red light emitting device;

wherein at least one of the blue light emitting device, green light emitting device, and red light emitting device comprises:

a substrate;

an n-type region overlying the substrate;

an active region overlying the n-type region;

a smoothing layer containing indium, the smoothing layer being located between the substrate and the active region; and a spacer layer located between the smoothing layer and the active region;

wherein the smoothing layer contains a greater dopant concentration than the spacer layer and a surface of the first smoothing layer is located less than one half of one micron from a surface of the active region.

* * * * *